United States Patent
Kim et al.

(10) Patent No.: US 9,280,007 B2
(45) Date of Patent: Mar. 8, 2016

(54) METHOD OF MANUFACTURING FLEXIBLE DISPLAY DEVICE

(75) Inventors: Tae-Youn Kim, Goyang-si (KR); Sang-Soo Kim, Paju-si (KR); Se-Jun Cho, Incheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 816 days.

(21) Appl. No.: 13/551,130

(22) Filed: Jul. 17, 2012

(65) Prior Publication Data

US 2013/0020731 A1    Jan. 24, 2013

(30) Foreign Application Priority Data

Jul. 18, 2011    (KR) .................. 10-2011-0070761

(51) Int. Cl.
*B29D 11/00*    (2006.01)
*G02F 1/1333*    (2006.01)

(52) U.S. Cl.
CPC ................. *G02F 1/133305* (2013.01)

(58) Field of Classification Search
IPC .......... G02F 1/13305; B29D 11/00788,11/0073
See application file for complete search history.

(56) References Cited

U.S. PATENT DOCUMENTS

2011/0052836 A1*    3/2011    Kim et al. .......... 428/1.1
2011/0108115 A1*    5/2011    Deligianni et al. .......... 136/262

FOREIGN PATENT DOCUMENTS

| CN | 1231065 A | 10/1999 |
|---|---|---|
| CN | 101866979 | 10/2010 |
| CN | 102082150 | 6/2011 |

OTHER PUBLICATIONS

Office Action issued in Chinese Patent Application No. 201210247047.9, mailed Aug. 4, 2014, 12 pages.
Office Action dated Oct. 9, 2015 for corresponding Chinese Patent Application No. 201210247047.9, 13 pages.

* cited by examiner

*Primary Examiner* — Mathieu Vargot
(74) *Attorney, Agent, or Firm* — Brinks Gilson & Lione

(57) ABSTRACT

A method of manufacturing a flexible display device includes forming a buffer layer on a base substrate, wherein the buffer layer is transparent and has a optical bandgap of about 3.0 eV to about 4.0 eV; forming a flexible substrate on the buffer layer; forming display elements on the flexible substrate; and irradiating a laser to the buffer layer to detach the flexible substrate from the base substrate.

11 Claims, 4 Drawing Sheets

METHOD OF MANUFACTURING FLEXIBLE DISPLAY DEVICE

This application claims the priority and the benefit under 35 U.S.C. §119(a) on Korean Patent Application No. 10-2011-0070761, filed on Jul. 18, 2011, the entire contents of which are hereby incorporated by reference.

BACKGROUND

1. Field of the Invention

The present disclosure relates to a method of manufacturing a display device.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panel (PDP) devices, field emission display (FED) devices, and electro-luminescence display (ELD) devices, as a substitute for CRTs. These flat panel displays have many advantages, such as thin profile, light weight, thin profile, and low voltage power supply requirements.

Since the flat panel display uses a glass substrate in order to endure high temperature occurring in manufacturing processes, there is a limit to light weight, thin profile and flexibility.

Accordingly, a flexible display device, which uses a flexible substrate made of a material such as plastic instead of a glass substrate, makes a rise.

However, since the flexible substrate has its good flexibility, it is difficult to use an manufacturing apparatus, which is designed for a glass or quartz substrate, for the flexible substrate. For example, it is impossible to transfer the flexible substrate using a track apparatus or robot or loading the flexible substrate on a cassette.

To solve these problems, a technology is suggested for manufacturing processes to be conducted in a state that the flexible substrate is attached to a base substrate made of glass or quartz using an adhesive material, and then the flexible substrate be detached from the base substrate.

In order to effectively detach the flexible substrate from the base substrate, the adhesive material should not be completely hardened in processes of forming display elements. To do this, a maximum temperature in the processes is required to be 150 degrees Celsius or less.

However, when a thin film transistor out of the display elements is formed at 150 degrees Celsius or less, its performance is degraded and its operation is not stable. This causes reliability of display device.

Further, even though the detaching process is finished, the adhesive material is not completely removed from the flexible substrate. Accordingly, to completely remove the adhesive material, additional process is required.

BRIEF SUMMARY

A method of manufacturing a flexible display device includes forming a buffer layer on a base substrate, wherein the buffer layer is transparent and has a optical bandgap of about 3.0 eV to about 4.0 eV; forming a flexible substrate on the buffer layer; forming display elements on the flexible substrate; and irradiating a laser to the buffer layer to detach the flexible substrate from the base substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 2A to 2G are cross-sectional views illustrating a method of manufacturing the flexible display device according to the embodiment of the present invention.

DETAILED DESCRIPTION OF THE DRAWINGS AND THE PRESENTLY PREFERRED EMBODIMENTS

Reference will now be made in detail to the illustrated embodiments of the present invention, which are illustrated in the accompanying drawings.

Figure 1:
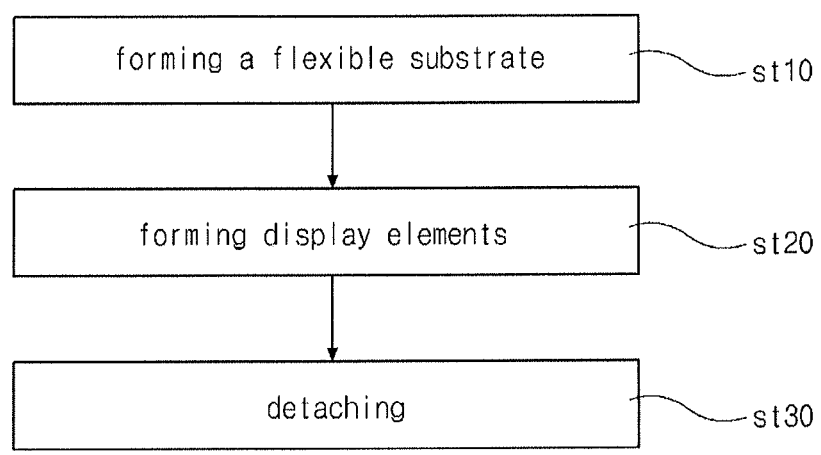
FIG. 1 is a flow chart illustrating a method of manufacturing a flexible display device according to an embodiment of the present invention.

FIG. 1 is a flow chart illustrating a method of manufacturing a flexible display device according to an embodiment of the present invention.

Referring to FIG. 1, the method includes a step st10 of forming a flexible substrate, a step st20 of forming display elements, and a step st30 of detaching.

The step st10 of forming the flexible substrate is a process of coating a base substrate, which may be made of glass or quartz, with a high molecular weight polymer to form the flexible substrate.

In more detail, the high molecular weight polymer, which has flexibility when hardened on the base substrate, for example, polyimide, is coated on an entire surface of the base substrate, and then the high molecular weight polymer is hardened. Accordingly, the flexible substrate can be formed.

It should be understood that materials other than polyimide may be used as the high molecular weight polymer. For example, siloxane group high molecular weight polymer can be used.

Accordingly, the flexible substrate can be effectively formed, and a manufacturing apparatus designed for a glass or quartz substrate can be used. For example, the flexible substrate attached to the base substrate can be transferred by a track apparatus or robot and loaded on a cassette, and processes such as thin film deposition, photolithography, etching and the like can be conducted without problems.

In the step st10, it is preferred that a buffer layer is formed on the base substrate before coating the polyimide on the base substrate. In other words, the buffer layer is located between the base substrate and the flexible substrate. It is preferred that the buffer layer may be made of zinc oxide (ZnO) or stannic oxide ($SnO_2$).

The base substrate and the flexible substrate may be detached from each other using a laser ablation of the buffer layer. This can be explained in detail later.

The step st20 of forming the display elements on the flexible substrate is a process of forming display elements for the flexible display to display images, such as thin film transistor, pixel electrode, gate and data lines, color filter layer, and the like.

For example, when the flexible display is an organic light emitting diode (OLED) display device, in the step st20, switching and driving transistors, and an organic light emitting diode, which includes first and second electrodes and an organic light emitting layer therebetween, are formed. The flexible substrate including such the display elements is attached to an encapsulation substrate.

After the step st20 is finished, the step st3 is conducted. The step st3 is a process of detaching the flexible substrate from the base substrate.

To do this, laser irradiates the buffer layer between the base substrate and the flexible substrate to evaporate at least a portion of the buffer layer. Accordingly, the flexible substrate is detached from the base substrate.

In more detail, when the buffer layer is exposed to the laser, a portion of the buffer layer is evaporated. The laser ablation is a phenomenon that when a high power laser irradiates a solid surface, a temperature of the solid surface rises in an moment and the solid surface melts and is evaporated, and atoms, molecules and ions thus come away in a moment.

In other words, when the buffer layer is irradiated by the laser, a temperature of the surface of the buffer layer rises in a moment.

Accordingly, the surface of the buffer layer changes in phase. In other words, the surface of the buffer layer changes from a solid phase into a liquid phase then changes from the liquid phase into a gas phase.

Since the liquid state exists very short, the surface of the buffer layer substantially changes from the solid phase into the gas phase.

Accordingly, because of the laser irradiation, the surface of the buffer layer is evaporated and removed. Therefore, the flexible substrate is detached from the base substrate.

As described above, the buffer layer is formed between the flexible substrate and the base substrate and is removed through the laser ablation. Accordingly, the flexible substrate can be attached to the base substrate without an adhesive material. Therefore, a manufacturing apparatus designed for a glass or quartz substrate can be applied to process the flexible substrate.

Further, solved can be the problem of the related art that a driving element such as a thin film transistor cannot be formed on a flexible substrate, which is attached to a base substrate using an adhesive material, at a temperature of 150 degrees Celsius or more. Accordingly, performance of a driving element can be prevented from being degraded.

Further, an additional process to remove an adhesive material is not required. Accordingly, production efficiency can be improved.

Further, the buffer layer is made of zinc oxide or stannic oxide that has a good adhesion to the base substrate. Accordingly, additional buffer layer is not required. In other words, when amorphous silicon is used as the buffer layer, it has a bad adhesion to the glass or quartz base substrate. This causes formation of additional buffer layer made of silicon oxide ($SiO_2$) or silicon nitride ($SiN_x$) between the base substrate and the amorphous silicon layer. Moreover, when the amorphous silicon is used, a green laser having a wavelength of 532 nanometers is required for ablation. However, since the green laser has a high energy, the laser may damage elements such as thin film transistor, organic light emitting diode and the like.

However, when the buffer layer is made of zinc oxide or stannic oxide, an infra-red (IR) laser having a wavelength of about 710 nanometers to about 1550 nanometers is used. Since the IR laser has an energy less than the green laser, the elements such as thin film transistor, organic light emitting diode and the like can be prevented from being damaged.

Further, since the buffer layer made of amorphous silicon has a low transmittance, recognition rate of an align key in forming display elements on the flexible substrate is reduced. Accordingly, a process of removing a part of the buffer layer of amorphous silicon at a region of the align key is additionally required.

However, since the buffer layer of zinc oxide or stannic oxide has a high transmittance, the above additional process is not required. Accordingly, production efficiency can be improved.

Further, since the buffer layer of zinc oxide or stannic oxide has a high transmittance, used can be an ultra-violet (UV) hardening that a UV ray irradiates a seal pattern from a rear surface of the base substrate to harden the seal pattern. The rear surface of the base substrate is opposite to a surface of the base substrate on which the buffer layer is formed. The seal pattern is between the flexible substrate and an opposing flexible substrate and along peripheral portions of the two flexible substrates.

Accordingly, in an instant of using the UV hardening when a liquid crystal display device is manufactured, hardening a seal pattern and injecting a liquid crystal between the flexible substrate having the display elements and the opposing flexible substrate can be simultaneously. This case can improve production efficiency compared to a case of hardening a seal pattern and then injecting a liquid crystal layer. In the liquid crystal display, the seal pattern is configured to surround the liquid crystal. The UV hardening may be conducted before the laser ablation of the buffer layer.

Further, high heat is not required to harden a seal pattern. Accordingly, exposing a liquid crystal to a high temperature condition and thus being transformed can be prevented.

A method of manufacturing the flexible display device according to the embodiment of the present invention is explained as follows.

FIGS. 2A to 2G are cross-sectional views illustrating a method of manufacturing the flexible display device according to the embodiment of the present invention.

Figure 2A:
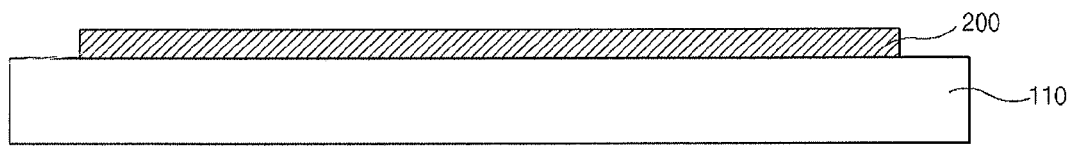

Referring to FIG. 2A, a buffer layer 200 is formed on a base substrate 110 made of glass or quartz. It is preferred, but not required, that the buffer layer 200 is made of zinc oxide or stannic oxide. However, other materials may be used for the buffer layer 200. For example, a transparent metal having an optical bandgap of about 3.0 eV to about 4.0 eV may be used for the buffer layer 200.

It is preferred, but not required, that the buffer layer 200 has a thickness of about 300 angstroms to about 5000 angstroms.

Figure 2B:
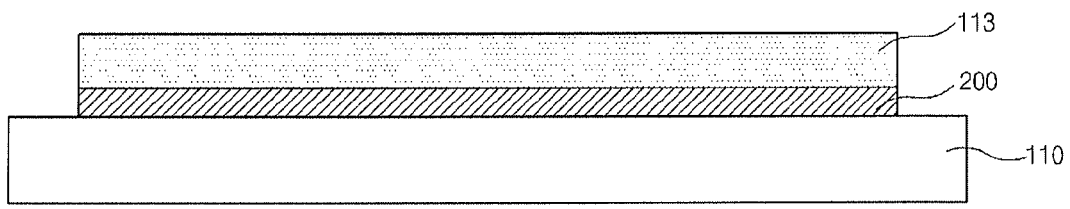

Then, referring to FIG. 2B, a high molecular weight polymer layer 113 is formed on an entire surface of the buffer layer 200 using a spin coating method or using a bar coating apparatus. The high molecular weight polymer layer 113 may be made of polyimide.

Figure 2C:
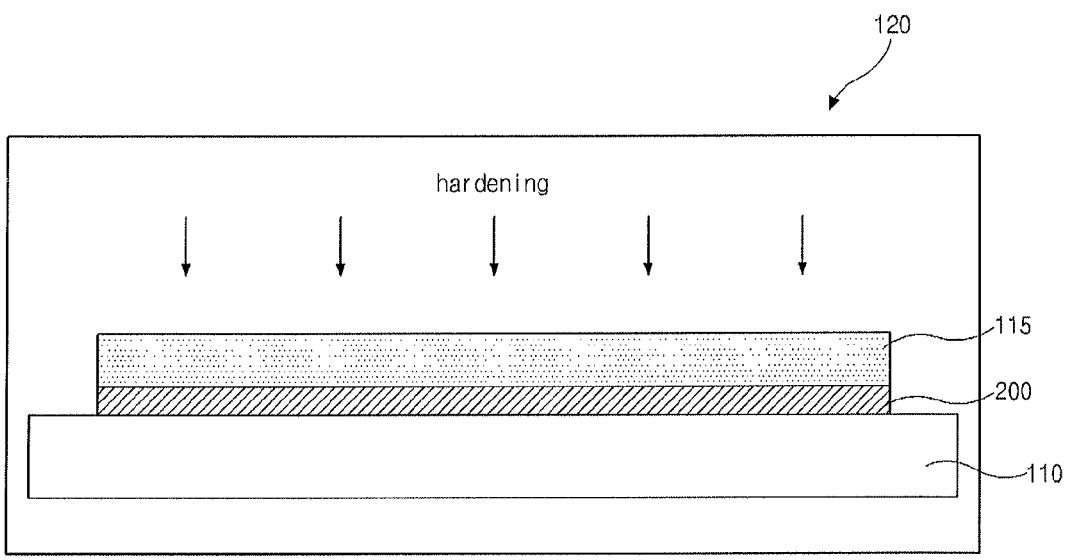

Then, referring to FIG. 2C, the base substrate 110 having the high molecular weight polymer layer 113 is placed in a hardening apparatus 120, for example, an oven or furnace to harden the high molecular weight polymer layer 113. The hardening process may be conducted at a temperature of about 150 degrees Celsius to about 300 degrees Celsius in a time of about 20 minutes to about 120 minutes.

The hardened high molecular weight polymer layer 113 functions as a flexible substrate 115. Accordingly, the buffer layer 200 is located between the base substrate 110 and the flexible substrate 115.

It is preferred, but not required, that the flexible substrate 115 has a thickness of about 50 micrometers to about 300 micrometers. When the thickness is less, the flexible substrate 115 may be disconnected in a detaching process later. When the thickness is greater, the flexible substrate 115 is thicker than a usual glass substrate, and thin profile cannot be achieved.

Then, referring to FIG. 2D, display elements for the display device are formed. Even though not shown in the drawings, another buffer layer may be formed on a surface of the flexible substrate 115 before forming the display elements for the display device. The another buffer layer may be made of an inorganic material, for example, silicon oxide ($SiO_2$) or silicon nitride (SiNx). The another buffer layer functions to improve an adhesion between the flexible substrate 115 made of the high molecular weight polymer and display elements to be formed on the flexible substrate 115, and to prevent emission of an organic gas or a fine organic particle from the high molecular weight polymer when the high molecular weight polymer is exposed to a high temperature condition.

The another buffer layer may have a single-layered structure using silicon oxide ($SiO_2$) or silicon nitride (SiNx). Alternatively, the another buffer layer may have a double-layered structure using both silicon oxide ($SiO_2$) and silicon nitride (SiNx).

In an instant of manufacturing an OLED display device, forming the display elements is as follows.

For the purpose of explanations, a pixel region is defined, which is a unit to display images and is surrounded by gate and data lines (not shown) crossing each other.

In each pixel region, a switching thin film transistor (not shown), a driving thin film transistor TDr and an organic light emitting diode E are formed on the flexible substrate 115.

In more detail, an amorphous silicon layer is formed on the flexible substrate 115, and is crystallized into a polycrystalline silicon layer.

Then, a mask process is conducted to pattern the polycrystalline silicon layer into a semiconductor layer 103.

Then, an inorganic insulating layer 105 made of silicon oxide ($SiO_2$) or silicon nitride (SiNx) is formed on the semiconductor layer 103.

Then, a first metal layer made of a lower resistance material, for example, aluminum (Al), aluminum alloy (e.g., AlNd), copper (Cu) or copper alloy, is formed on the gate insulating layer 105, and is patterned in a mask process to form a gate electrode 107 corresponding to a center portion of the semiconductor layer 115. In this process, the gate line connected to the gate electrode 107 is formed.

Then, an n-type or p-type doping process is conducted using the gate electrode 107 as a doping mask. Accordingly, both side portions of the semiconductor layer 103 not covered by the gate electrode 107 are doped and become source and drain regions 103b and 103c, respectively, and the center portion of the semiconductor layer 103 not doped becomes an active layer 103a.

Then, a first inter-layered insulating film 109a is formed on an entire surface of the flexible substrate 115 having the semiconductor layer 103. The first inter-layered insulating film 109a may be made of an inorganic insulating material, for example, silicon oxide ($SiO_2$) or silicon nitride (SiNx). A mask process is conducted to pattern the first inter-layered insulating film 109a and the gate insulating layer 105. Accordingly, first and second semiconductor contact holes 116 exposing the source and drain regions 103b and 103c, respectively, are formed.

Then, a second metal layer made of aluminum (Al), aluminum alloy (e.g., AlNd), copper (Cu), copper alloy, chromium (Cr) or molybdenum (Mo) is formed on the first inter-layered insulating film 109a, and is patterned in a mask process to form source and drain electrodes 110a and 110b, which contacts the source and drain regions 103b and 103c through the second semiconductor contact holes 116. In this process, the data line connected to the source electrode 110a is formed.

The semiconductor layer 103, the gate insulating layer 105, the gate electrode 107, the first inter-layered insulating film 109a and the source and drain electrodes 110a and 110b form the driving thin film transistor DTr.

Then, a second inter-layered insulating film 109b is formed on the flexible substrate 115 having the source and drain electrodes 110a and 110b and patterned in a mask process to form a drain contact hole 117 exposing the drain electrode 110b. The second inter-layered insulating film 109b may be made of an organic insulating material, for example, photo acrylic or benzocyclobutene (BCB).

Then, a first electrode 111 is formed on the second inter-layered insulating film 109b. The first electrode 111 contacts the drain electrode 110b through the drain contact hole 117. The first electrode 111 is an element of the organic light emitting diode E and may function as an anode.

Then, a bank 119 is formed on the first electrode 111. The bank 119 may be made of an photosensitive organic insulating material, for example, black resin, graphite powder, gravure ink, black spray or black enamel. The bank 119 has a lattice structure and separates pixel regions.

Then, an organic light emitting layer 113 is formed on the bank.

Then, a second electrode 115 is formed on the organic light emitting layer 113. The second electrode 115 may include a semi-transparent metal layer, which is deposited thin and has a low work function, and a transparent conductive material layer which is deposited thick. The first electrode 111, the organic light emitting layer 113 and the second electrode 115 form the organic light emitting diode E.

An encapsulation film 130 made of a flexible material is located over the organic light emitting diode E for encapsulation. The encapsulating film 130 is attached to the flexible substrate 110 having the organic light emitting diode E.

Figure 2E:
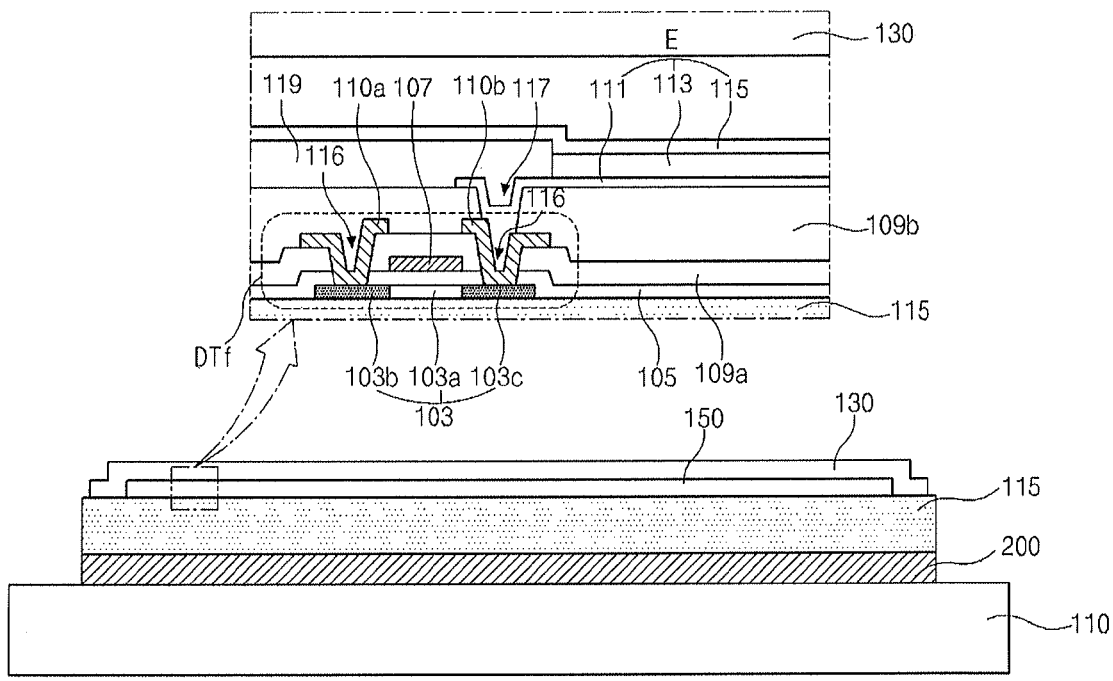
Figure 2E:
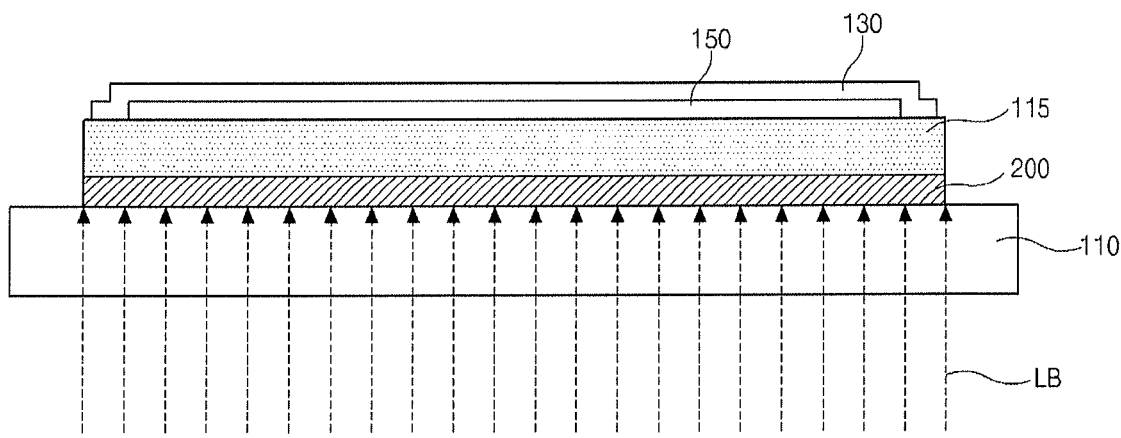
Figure 2F:
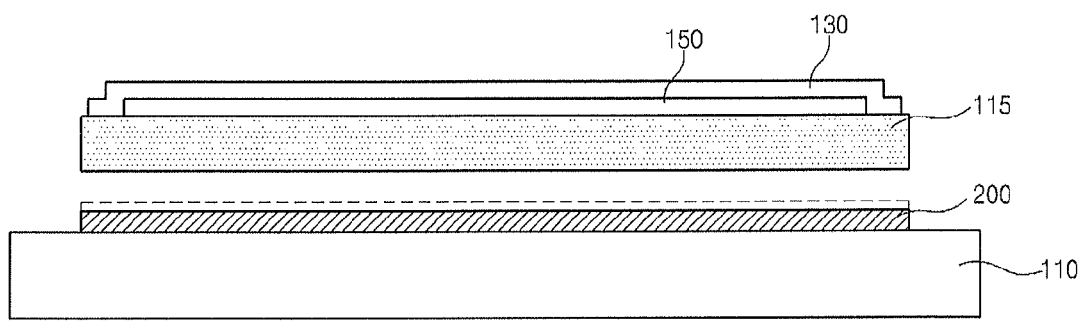

Then, referring to FIG. 2E, an IR laser LB irradiates the buffer layer 200 in a state that the encapsulation film 130 is attached to the flexible substrate 115.

Back irradiation of the IR laser LB is preferred, but nor required. In other words, the IR laser LB irradiates from the rear surface of the base substrate 110. Through the laser irradiation, the buffer layer 120 is evaporated. Accordingly, referring to FIG. 2F, the flexible substrate 115 can be effectively detached from the base substrate 110.

Figure 2G:
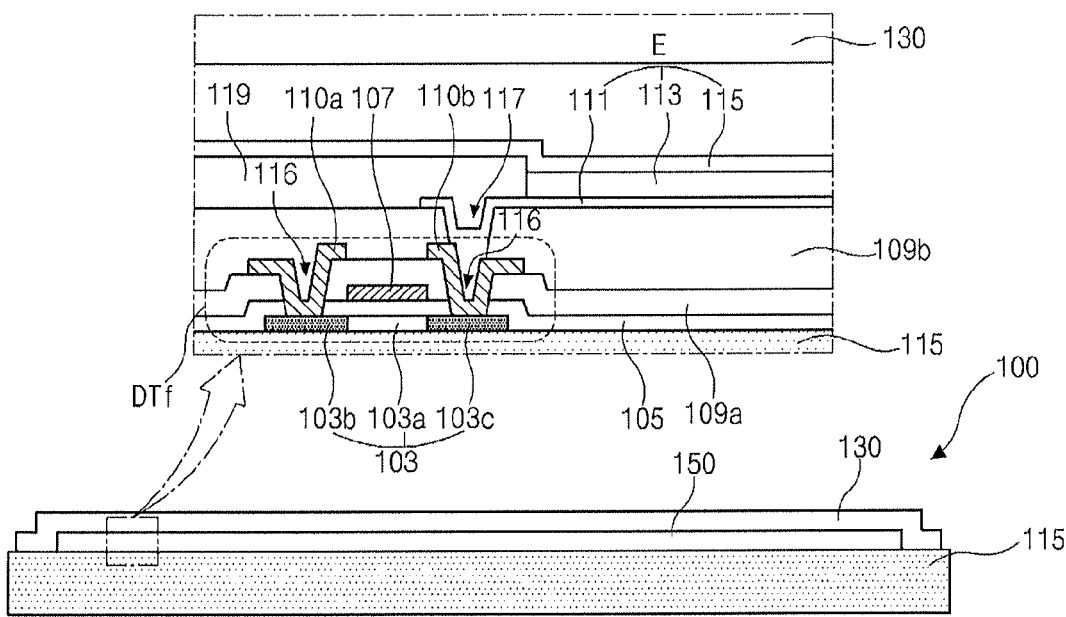

Through the above processes, the flexible display device 100 can be manufactured, as shown in FIG. 2G.

As described above, the flexible substrate is attached to the base substrate 110 without an adhesive material. Accordingly, a manufacturing apparatus designed for a glass or quartz substrate can be applied to process the flexible substrate, and the problem of the related art can be solved that a driving element such as a thin film transistor cannot be formed on a flexible substrate, which is attached to a base substrate using an adhesive material, at a temperature of 150 degrees Celsius or more. Accordingly, performance of a driving element can be prevented from being degraded.

Further, an additional process to remove an adhesive material is not required, and production efficiency can be thus improved.

Further, since the buffer layer is made of zinc oxide or stannic oxide that has a good adhesion to the base substrate, additional buffer layer is not required. Further, the elements such as thin film transistor, organic light emitting diode and the like can be prevented from being damaged in detaching the flexible substrate from the base substrate.

Further, an additional partial light exposure process is not required, and production efficiency can be thus improved. Further, the UV hardening that hardens the seal pattern through the back irradiation can be used. This can makes production efficiency improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A method of manufacturing a flexible display device, the method comprising:
   forming a buffer layer on a base substrate, wherein the buffer layer is transparent and has an optical bandgap of about 3.0 eV to about 4.0 eV;
   forming a flexible substrate on the buffer layer;
   forming display elements on the flexible substrate;
   forming a seal pattern between the flexible substrate and another flexible substrate opposing to the flexible substrate;
   hardening the seal pattern using an ultra-violet (UV) ray, while simultaneously injecting a liquid crystal layer between the flexible substrate and the another flexible substrate; and
   to ablating the buffer layer by a laser to completely remove the buffer layer from the flexible substrate and to detach the flexible substrate from the base substrate.

2. The method according to claim 1, wherein the buffer layer comprises zinc oxide or stannic oxide.

3. The method according to claim 1, wherein the laser is an infra-red (IR) laser having a wavelength of about 710 nanometers to about 1550 nanometers.

4. The method according to claim 1, wherein forming the flexible substrate includes:
   forming a high molecular weight polymer layer on the buffer layer; and
   hardening the high molecular weight polymer layer to form the flexible substrate.

5. The method according to claim 1, further comprising forming another buffer layer on the flexible substrate before forming the display elements, wherein the another buffer layer is made of an inorganic insulating material.

6. The method according to claim 1, wherein the laser is irradiated from a surface of the base substrate opposite to a surface of the base substrate on which the buffer layer is formed.

7. The method according to claim 1,
   wherein the laser is irradiated to the buffer layer after hardening the seal pattern.

8. The method according to claim 7, wherein the ultra-violet ray is irradiated from a surface of the base substrate opposite to a surface of the base substrate on which the buffer layer is formed.

9. The method according to claim 1, wherein the flexible substrate has a thickness of about 50 micrometers to about 300 micrometers.

10. The method according to claim 1, wherein the buffer layer has a thickness of about 300 angstroms to about 5000 angstroms.

11. The method according to claim 4, wherein the high molecular weight polymer layer is hardened at a temperature of about 150 degrees Celsius to about 300 degrees Celsius in a time of about 20 minutes to about 120 minutes.

* * * * *